United States Patent [19]

Kravitz

[11] 4,106,952
[45] Aug. 15, 1978

[54] SOLAR PANEL UNIT

[76] Inventor: Jerome H. Kravitz, 12403 Braxfield Ct., Rockville, Md. 20952

[21] Appl. No.: 831,962

[22] Filed: Sep. 9, 1977

[51] Int. Cl.² .......................... H01L 31/04; F24J 3/02
[52] U.S. Cl. .............................. 136/89 HY; 126/270; 126/271; 136/89 PC; 136/206
[58] Field of Search ............. 136/89 PC, 89 HY, 206; 126/270, 271

[56] References Cited

U.S. PATENT DOCUMENTS

| 2,888,007 | 5/1959 | Tabor | 126/270 |
| 2,989,575 | 6/1961 | Wallace, Jr. | 136/89 |
| 3,018,313 | 1/1962 | Gattone | 136/89 |
| 3,023,257 | 2/1962 | Fritts | 136/4 |
| 3,866,285 | 2/1975 | Clark | 29/157 R |
| 3,956,017 | 5/1976 | Shigemasa | 136/89 |
| 3,985,116 | 10/1976 | Kapany | 126/270 |
| 4,002,031 | 1/1977 | Bell | 60/641 |
| 4,026,267 | 5/1977 | Coleman | 126/270 |
| 4,029,519 | 6/1977 | Schertz et al. | 136/89 PC |
| 4,056,405 | 11/1977 | Varadi | 136/89 PC |

OTHER PUBLICATIONS

M. A. Doguay, "Solar Electricity: The Hybrid System Approach", *American Scientist*, vol. 65, pp. 422–427 (1977).
D. G. Scheuler et al., "Integration of Photovoltaic & Solar-Thermal Energy Conversion Systems", *Conf. Record*, 11th IEEE *Photovoltaic Specialists Conf.*, May 1975 pp. 327–331.
A. Bohg et al., "Solar Energy Collector" *IBM Tech. Disc. Bull.*, vol. 19, pp. 2581–2582 (1976).

*Primary Examiner*—Aaron Weisstuch
*Attorney, Agent, or Firm*—Beall & Jeffery

[57] ABSTRACT

The elements of the solar panel are arranged generally in parallel planes that, starting from the top, include a transparent sheet, a plurality of converging lenses, a plurality of solar cells arranged in electrical series respectively aligned with the converging lenses, an electrically insulating support plate that together with the sides of the solar unit and the top sheet form a vacuum chamber for the lenses and solar cells to reduce heat transfer by convection and conduction upwardly from the solar cells, a thermopile, a heat sink plate receiving heat from the thermopile, heat transfer fins receiving heat from the heat sink plate, a serpentine conduit in heat exchange with the heat fins, thermal insulation, and a bottom plate that is connected to the side walls. Two side walls contain mating couplings for each of the conduit, thermopile, and photoelectric cells so that two adjacent panels may be interconnected with such couplings to provide fluid connection and electrical connection between the adjacent panels.

10 Claims, 2 Drawing Figures

SOLAR PANEL UNIT

BACKGROUND OF THE INVENTION

The present invention relates to a solar panel unit that may collect solar energy and convert it into a more reusable energy form, such as electrical energy or a heated liquid.

Due to the increase in cost and depletion of fossil fuels, other energy sources are becoming increasingly important, and the use of solar energy has great potential. One of the main problems with the solar panels employed today is that their efficiency is relatively low so that a large surface area is required to produce a usable quantity of energy.

SUMMARY

It is an object of the present invention to produce a more efficient solar panel, so that thereby for a given quantity of desired usable energy, the area of solar panel required will be at a minimum.

Lenses are provided to concentrate the solar energy onto photoelectric cells for the production of electricity, and the heat that is necessarily produced is prevented from leaving the system, to a large extent, by an evacuated chamber while at the same time reflected radiation is limited due to the greenhouse effect of the top transparent sheet that assists in the formation of the evacuated chamber. The heat thus produced is conducted downwardly to a thermopile where it is partially converted to electricity, and further conducted downwardly to where it is used to finally heat water that may be used in the hot water system of a residence or for space heating purposes at a remote location. Thermal insullation is provided below the water pipes.

The panels are provided with electrical and fluid couplings so that adjacent panels may be connected together.

BRIEF DESCRIPTION OF A PREFERRED EMBODIMENT

Further objects, features and advantages of the present invention are shown in the accompanying drawing, which shows a preferred embodiment that is at the present time the best known mode of construction.

FIG. 1 is a partial cross sectional elevational view of two adjacent solar panels constructed according to the present invention, and as taken along line I—I of FIG. 2; and FIG. 2 is a partial cross sectional view taken along line II—II of FIG. 1.

DETAILED DESCRIPTION OF A PREFERRED EMBODIMENT

Figure 1:
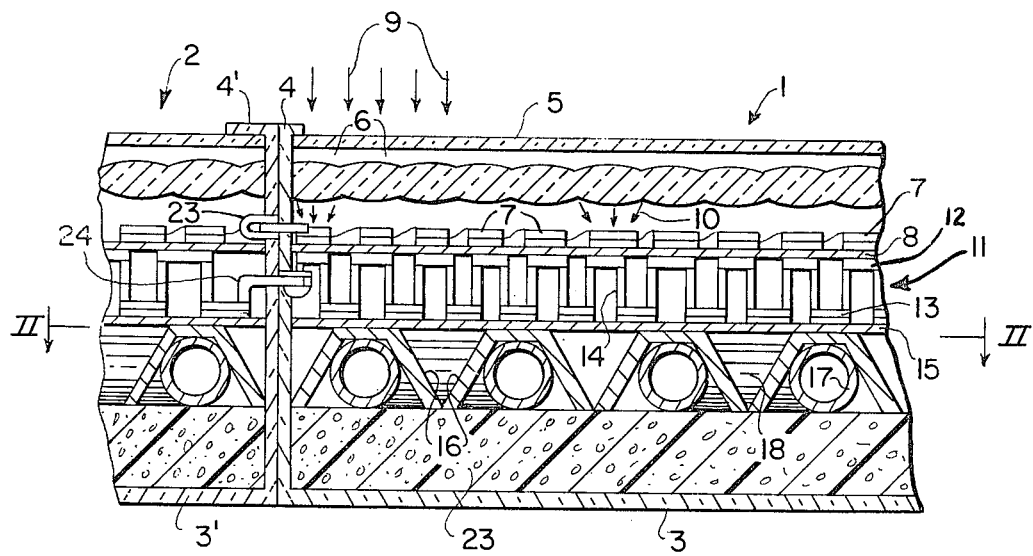
Figure 2:
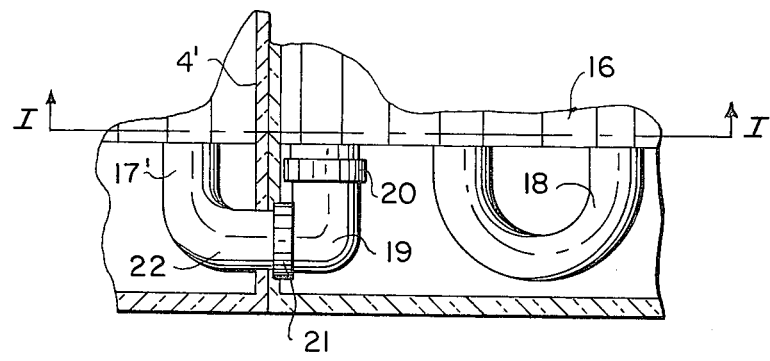

FIGS. 1 and 2 disclose portions of two adjacent and intercoupled solar panel units, which are of identical construction. For example, the portion shown of the left hand unit could be joined to the right side of the portion of the right hand unit to represent a single complete unit, and because in this manner a single unit is completely shown effectively, portions of each unit have been removed to simplify the disclosure. In plan view, each unit would preferably be of rectangular configuration, so that a plurality of such units could be interconnected across a roof or other support to form a composite solar collecting panel of a desired cross sectional area.

Since the solar panel unit 1 and solar panel unit 2 are of identical construction, the same numerals will be used for the two panels, with primes being used for the numerals of panel two, and the description of one will suffice for the other.

The solar panel unit 1 has an upwardly opening enclosure formed by a bottom wall 3 and side walls 4 extending around the entire periphery of the bottom wall 3. The top of the enclosure is closed by means of a self supporting sheet of material transparent to solar radiant energy, for example glass 5. Immediately beneath and parallel to the glass 5, there is a sheet of material transparent to solar radiant energy and providing a plurality of circular, as seen in plan view, lenses 6. The lenses 6 may be of the same construction as those shown in U.S. Pat. No. 3,929,121 issued Dec. 30, 1975. Immediately beneath the lenses 6, there are provided a plurality of electrically serially interconnected photoelectric cells 7, which may be of identical construction to and interconnected in the same manner as the photoelectric cells of U.S. Pat. No. 4,002,031 issued Jan. 11, 1977. Beneath the cell 7, there is provided a support plate 8, which is constructed of electrically insulated material that has good thermal conductivity. The plate 8 and top 5 are sealingly connected around their entire peripheries to the side walls 4, so as to form with the side walls 4 a hermetically sealed enclosure that is evacuated so as to greatly decrease heat transfer by conductivity or convection from the photoelectric cells 7 to the top plate 5.

As shown, the unit would be arranged so that preferably the solar radiant energy as indicated by arrows 9 will pass through the transparent plate 5 in a direction perpendicular to the plane of the plate 5 and be concentrated by means of the lenses 6 so as to converge in concentrated beams 10 onto the individual photoelectric cells 7, with a number of lenses preferably being equal to the number of vertically aligned photoelectric cells 7. In this manner, the majority of the solar radiation will strike the photoelectric cells 7 so as to produce electricity in each of the cells, with the cells being serially connected so as to produce a useful voltage between the positive and negative electrical terminals of the serially connected photoelectric cells 7 of each unit.

Any radiation that does not strike the photoelectric cells 7 will strike the support plate 8, which is preferably black to absorb the radiation and convert it into heat. Since the enclosure formed by the plates 5, 8 and side walls 4 is evacuated, the heat generated within the photoelectric cells 7 and the plate 8 will be conducted downwardly.

Beneath the support plate 8, there is a thermopile 11 that is preferably of the same construction as shown in U.S. Pat. No. 2,984,696, issued May 16, 1961. The top conductors 12 of the thermopile are connected to the bottom conductors 13 by means of thermocouples 14 in a known manner so that the thermopile will produce a substantial useful voltage at its positive and negative output terminals according to the number of thermocouples connected in series, while transferring heat from the support plate 8 downwardly to the conductors 12 and from there to the conductors 13. The conductors 13 are in direct engagement with a heat sink plate 15 that forms the cold junction of the thermopile. Preferably, the heat sink plate 15 is hermetically sealed around its entire periphery to the side walls 4, so that the area containing the thermopile may be evacuated. If desired, the support plate 8 need not be hermetically sealed to the side walls 4 if the heat sink plate 15 is sealed.

Any heat that has not been converted into electrical energy with the thermopile is received by the heat sink plate 15 and conducted downwardly by means of heat exchange fins 16 that are preferably bonded to the lower surface of the heat sink plate 15 on their upper end and extend downwardly so as to substantially surround the parallel portions of a serpentine pipe 17, with the fin 16 and pipe 17 being joined by solder or the like to improve the heat transfer. As shown in FIG. 2, U-shaped bends 18 of the pipe 17 joined the ends of the parallel straight sections of the pipe 17 to form one single serpentine conduit for each solar panel unit. One end of the conduit is provided with a right angle joint 19, having its portion 20 permanently secured to the one end of the conduit and its portion 21 providing a releasable conduit coupling. The portion 20 may be soldered to its end of the pipe 17, whereas the portion 21 may include an aperture of the same diameter as the pipe 17 provided with an O-sealing ring to form a fluid tight seal with pipe 17 inserted within the end 21. The opposite end of the conduit is provided with a right angle bend 22 to provide a coupling portion extending beyond the side wall of its unit, so as to be telescopically received in sealing engagement within the coupling 19. In this manner, two adjacent solar panel units may be fluid interconnected so that their serpentine pipes will be serially connected.

In the event that the solar panel unit is to be exposed to the environment, and the environment is to upon occasion drop below freezing at time when solar energy is not available, for example at night, it is desirable to provide thermal insulation 23 below the pipes 17, which insulation will also insure that the heat reaching the pipe 17 will not travel any further downwardly to any substantial extent.

As mentioned above, the serial array of photoelectric cells 7 will have, for each solar panel unit, a positive electrical output terminal and a negative electrical output terminal. Preferably, one of such terminals will be provided with a releasable coupling part so as to extend through the side wall having the fluid coupling 19, whereas the other part of a mating releasable electrical coupling will be electrically connected to the other terminal so as to extend through the side wall having the releasable fluid coupling 22, with such electrical coupling parts being in corresponding locations so that they will interconnect when the fluid couplings 19, 22 interconnect. Such electrical couplings may be conventional bayonet connections or the like. In the same manner, the output terminals of the thermopiles are connected between adjacent units with releasable electrical coupling 24. Thus, the positive output terminal of the serially arranged photoelectric cells 7 of unit 1 may be electrically connected through releasable electrical coupling 23 to the negative output terminal of the photoelectric cells 7' of the unit 2, one of the positive and negative electrical terminals of the thermopile 11 may be connected through releasable electrical coupling 24 to the other of the positive and negative terminals of the thermopile 11' of unit 2, and the downstream end of pipe 17 may be connected through releasable fluid coupling 19, 22 to the upstream end of pipe 17 of unit 2, all of which may be accomplished by merely aligning the units 1 and 2 and horizontally pushing the units together to telescopically engage their couplings. When an entire composite of panels has been assembled for the desired area, the exposed couplings at the outer sides of the composite may be interconnected by fluid conduits and electrical conductors respectively either in series or parallel as desired.

Water or some other liquid may be passed through the serially connected pipe 17 to be heated, and this hot water may be stored to be used as needed for the heating of enclosures through hot water radiators or for supplying hot water for domestic use such as showers. The use of hot water for heating purposes and domestic consumption is shown in U.S. Pat. No. 2,946,945 issued July 26, 1960. Also, the hot water produced may be used in heat exchange with a fluid to be evaporated for the running of a turbine, as disclosed in U.S. Pat. No. 4,002,031 issued Jan. 11, 1977.

The electrical energy produced by the photoelectric cells and the thermopile may be stored in a battery for later usage as disclosed in U.S. Pat. No. 2,946,945 issued July 26, 1960. Also, the electricity produced by the thermopile and photoelectric cells may be employed as the electrical energy source for the system disclosed in U.S. Pat. No. 3,459,953 issued Aug. 5, 1969 for the production of hydrogen and oxygen through electrolysis, which gases are stored and later withdrawn to be burned to produce products of combustion for driving a gas turbine that in turn drives an electrical generator providing electrical energy for usage as desired, with the products of combustion being condensed after passing through the turbine to provide pure water that may either be a source of pure water for any desired purpose or a source of water for the electrolysis unit.

The disclosure of the above mentioned patents is incorporated herein in its entirety for the purposes mentioned to produce the entire solar energy conversion system of the present invention.

In operation, the solar panel unit of the present invention is designed to extract approximately 76% of the solar energy striking it, and to convert the energy into other forms of more usable energy. The extraction-conversion process is accomplished in three separate stages, with each stage employing a different type of process. The first stage involves the use of photoelectric conversion through the employment of solar batteries, photovoltaic cells, or photoelectric cells, which all broadly are referred to in the present invention as photoelectric cells, meaning transducers that will receive direct solar radiant energy and convert it directly into electrical energy. The second stage involves the use of thermoelectric conversion whereby heat differentials are converted into electric power, and in the present invention the term thermopile is used to broadly indicate such a device that directly converts heat into electricity. The third stage acts as a heat sink for the second stage as the cold terminal, and in so doing heats cold water which is then stored in hot water facilities. The hot water can later be used for the heating of a home or for other hot water requirements of a dwelling.

Although solar energy varies greatly depending upon a number of conditions, a valid assumed rate of 1 Langley radiation per minute for many locations in the United States appears to be a reasonable working estimate. Thus, a square meter receives approximately 10 kcal per minute of solar radiation. Over the span of one average bright day (8 hours radiation) a home roof of approximately 1,000 square feet will receive approximately 500,000 kcal of energy. This is roughly equivalent to 13 or 14 gallons of gasoline. With an extraction-conversion process having 76% efficiency, the average home would on a bright day be able to produce the equivalent of 9.88 gallons of gasoline. Of course, if more energy were required this would simply entail enlarging the unit.

The efficiency of the present invention is in part accomplished by the top wall 5 that will admit most of the radiant energy and prevent reradiation of the wave length through a greenhouse effect. That is, the material of the cover or top wall 5 will transmit the long wave lengths of light, allowing them to enter the unit, but will not transmit the short wave lengths of reflected or reradiated energy, thereby trapping the energy within the unit. Some of the radiant energy will be directly converted to electricity by the photoelectric cell 7, whereas the rest of the energy trapped within the unit will be converted to heat. Because of the insulation 23, which may be rigid foam plastic, for example polystyrene, and the evacuation of the chamber between the sheets 5 and 8 at least, or between the sheets 5 and 15, there will be very little loss of heat through conduction and convection.

The solar battery units will be preferably of semiconductive material with a conversion efficiency of 10%. The thermopile will use some of the heat to produce electricity and conduct the remainder of the heat downwardly through the unit. The thermopile is constructed, in a known manner, of a plurality of thermocouples having two dissimilar metals or semiconductors joined so as to produce a hot junction (above) and a cold junction (below), which will produce electricity. When the thermocouples are arranged in series, the electricity will be of a substantial usable voltage. The conversion efficiency of such a thermopile is approximately 10%. The heat sink that is necessary for a thermopile is provided by the metal plate 15 and the heat withdrawn by the water passing through the pipe 17, with the usable heat in the water raising the efficiency of the entire unit up to the above mentioned approximately 76%.

The fluid and electrical connections between some of the units may also be in parallel instead of in series, as desired, particularly along the outer edges of the assembled units; some of the connections internally of a unit may be in parallel. For optimum light collection, the side walls 4, 4' may also be transparent, and the side walls 4, 4' may be formed in one piece with the top 5 to be closed by a separate bottom 3.

While a preferred embodiment has been shown in detail for purposes of illustrating the best mode known at the present time, further embodiments, variations and modifications are contemplated according to the broader aspects of the present invention, all is determined by the spirit and scope of the following claims.

What is claimed is:

1. A solar energy conversion system, comprising:
   a top fluid impervious sheet that freely passes solar radiant energy;
   a plurality of photoelectric cell means arranged in a plane spaced below and parallel to said top sheet for receiving the solar radiant energy and directly converting a portion into electricity and converting substantially the remainder into heat;
   means electrically connecting said photoelectric cell means in a power producing circuit;
   a thermopile means below said photoelectric cell means for receiving the heat, converting a portion of the heat into electrical energy, and transmitting the remainder of the heat downwardly;
   support means between said array of photoelectric cell means and said thermopile means for electrically insullating said thermopile means from said photoelectric cell means, for conducting heat downwardly, and converting any radiant energy directly received thereon into heat;
   a planar heat sink means immediately below said thermopile means for receiving and transmitting downwardly the heat transmitted by said thermopile means; and
   liquid conduit means beneath and in heat exchange relationship with said heat sink means.

2. The solar energy conversion system of claim 1, including side walls around the entire periphery of said top sheet, photoelectric cell means, support means, thermopile means, heat sink means and conduit means to form an enclosed unit; one of said side walls having a first releasable electrical coupling part electrically connected to one of the electrical terminals of said thermopile means, a second releasable electric coupling part electrically connected to one of the electrical terminals of said photoelectric cell means, and a first conduit coupling part fluid connected to one end of said conduit means; another of said side walls having a third releasable electrical coupling part of a mating configuration with said first releasable electrical coupling part being electrically connected to the other of the electrical terminals of said thermopile means, and being at a location to register with the first electrical coupling part of a horizontally aligned and immediately adjacent identical unit; said another side wall having a fourth electrical coupling part of a mating configuration with said second releasable electrical coupling part, being electrically connected to the other of the electrical terminals of said series connected photoelectric cell means, and being at a location to register with the second releasable electrical coupling part of the horizontally aligned and immediately adjacent identical unit; said another side wall further having second conduit coupling part of complementary mating shape to said first conduit coupling part, fluid connected to the opposite end of said conduit means, and being at a location so as to matingly register with the first conduit coupling part of the horizontally aligned immediately adjacent identical unit.

3. The solar energy conversion system of claim 2, including a planar array of converging lenses spaced below and parallel to said top sheet for receiving the solar radiant energy passing through said top sheet and producing a plurality of radiant energy concentrations respectively on said plurality of photoelectric cell means.

4. The solar energy conversion system of claim 2, comprising a layer of thermal insulation immediately beneath said conduit means.

5. The solar energy conversion system of claim 2, including means including said top sheet for forming a hermetically sealed vacuum enclosure having therein at least said photoelectric cell means for reducing heat transfer by convection and conduction upwardly away from said photoelectric cells and said support means.

6. The solar energy conversion system of claim 2, including said conduit means comprising a metallic pipe arranged in a serpentine path within a single plane parallel to and closely spaced to said heat sink means; and a plurality of heat transfer fins bonded to the lower surface of said heat sink means and extending downwardly to partially surround at least a major portion of said pipe.

7. The solar energy conversion system of claim 1, including a planar array of converging lenses spaced below and parallel to said top sheet for receiving the solar radiant energy passing through said top sheet and producing a plurality of radiant energy concentrations respectively on said plurality of photoelectric cell means.

8. The solar energy conversion system of claim 1, including a layer of thermal insulation immediately beneath said conduit means.

9. The solar energy conversion system of claim 1, including means including said top sheet for forming a hermetically sealed vacuum enclosure having therein at least said photoelectric cell means for reducing heat transfer by convection and conduction upwardly away from said photoelectric cells and said support means.

10. The solar energy conversion system of claim 1, including said conduit means comprising a metallic pipe arranged in a serpentine path within a single plane parallel to and closely spaced to said heat sink means; and a plurality of heat transfer fins bonded to the lower surface of said heat sink means and extending downwardly to partially surround at least a major portion of said pipe.

* * * * *